US009185752B2

(12) United States Patent
Radermacher et al.

(10) Patent No.: US 9,185,752 B2
(45) Date of Patent: Nov. 10, 2015

(54) CIRCUIT ARRANGEMENT FOR SELECTIVE POWERING OF DISTRIBUTED LOADS

(71) Applicant: KONINKLIJKE PHILIPS N.V., Eindhoven (NL)

(72) Inventors: Harald Josef Günther Radermacher, Aachen (DE); Adrianus Sempel, Waalre (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/364,425

(22) PCT Filed: Dec. 5, 2012

(86) PCT No.: PCT/IB2012/056972
§ 371 (c)(1),
(2) Date: Jun. 11, 2014

(87) PCT Pub. No.: WO2130/088305
PCT Pub. Date: Jun. 20, 2013

(65) Prior Publication Data
US 2014/0320043 A1    Oct. 30, 2014

Related U.S. Application Data

(60) Provisional application No. 61/569,417, filed on Dec. 12, 2011.

(51) Int. Cl.
H05B 33/08    (2006.01)
H03K 17/945   (2006.01)
H03K 17/95    (2006.01)
H03K 17/955   (2006.01)
H05B 37/02    (2006.01)

(52) U.S. Cl.
CPC .............. *H05B 33/08* (2013.01); *H03K 17/945* (2013.01); *H03K 17/952* (2013.01); *H03K 17/955* (2013.01); *H05B 33/0845* (2013.01); *H05B 37/0227* (2013.01); *H03K 2217/96066* (2013.01); *Y02B 20/44* (2013.01); *Y10T 307/406* (2015.04)

(58) Field of Classification Search
CPC ............................ H05B 33/08; H03K 17/945
See application file for complete search history.

(56) References Cited

U.S. PATENT DOCUMENTS

| 7,884,558 | B2 | 2/2011 | Steele et al. | |
| 8,203,349 | B2* | 6/2012 | Motojima et al. | 324/655 |
| 2007/0119698 | A1* | 5/2007 | Day | 200/510 |
| 2010/0027306 | A1 | 2/2010 | Loef et al. | |

(Continued)

FOREIGN PATENT DOCUMENTS

WO    2010064184 A1    6/2010

*Primary Examiner* — Douglas W Owens
*Assistant Examiner* — Pedro C Fernandez
(74) *Attorney, Agent, or Firm* — Yuliya Mathis

(57) ABSTRACT

A circuit arrangement for selective powering of distributed loads (D1-D7, 220-226, 213a-213e) is provided, comprising a plurality of load segments (10, 20, 30, 40, 50, 60, 70), each being electrically connected to at least one supply terminal al for receiving a variable voltage, wherein each load segment (10, 20, 30, 40, 50, 60, 70) comprises at least a load unit (D1-D7, 220-226, 213a-213e) and a proximity sensor unit (11), coupled with said load unit and comprising at least a reactive device (L1-L7, L1a-L7a, C1-C7, C1a-C7a, 214a-214e, 215d) having a reactance, said reactance depending on the proximity of a detection object (100, 102). In order to provide a simple and accurate way for user interactive powering of loads (D1-D7, 220-226, 213a-213e), during operation an operating voltage is provided to at least one load unit (D1-D7, 220-226, 213a-213e), depending on the reactance of at least one reactive device (L1-L7, L1a-L7a, C1-C7, C1a-C7a, 214a-214e, 215d) of said load segments (10, 20, 30, 40, 50, 60, 70), so that said operating voltage depends on the proximity of said detection object (100, 102).

15 Claims, 6 Drawing Sheets

(56) References Cited

U.S. PATENT DOCUMENTS

| | | |
|---|---|---|
| 2010/0181923 A1 | 7/2010 | Hoogzaad |
| 2011/0025230 A1* | 2/2011 | Schulz et al. .................. 315/294 |
| 2011/0234097 A1* | 9/2011 | Radermacher .................. 315/53 |
| 2013/0120003 A1* | 5/2013 | Sheikman et al. ............. 324/637 |

* cited by examiner

CIRCUIT ARRANGEMENT FOR SELECTIVE POWERING OF DISTRIBUTED LOADS

CROSS-REFERENCE TO PRIOR APPLICATIONS

This application is the U.S. National Phase application under 35 U.S.C. §371 of International Application No. PCT/IB2012/056972, filed on Dec. 5, 2012, which claims the benefit of 61/569417, filed on Dec. 12, 2011. These applications are hereby incorporated by reference herein.

TECHNICAL FIELD

The invention relates to a circuit arrangement for selective powering of distributed loads, an LED lamp and a method of selective powering of distributed loads.

BACKGROUND ART

With the increasing importance of LED-based lighting, LEDs already have a significant role in the area of decorative lighting. The low power consumption and long lifetime of LEDs make them a highly favorable choice for various applications. Moreover, LEDs having various colors are known in the art. It is also known, for instance, to combine red, green and blue LEDs to create the impression of a virtually unlimited variety of colors.

Especially when controlling numerous LEDs to create certain distributed effects, like LEDs on a string of lights or on a lighting surface, the cost of control electronics has to be taken into account. While relatively cheap LEDs are available today, a need exists to control the LED arrangement by means of simple and cheap control elements.

For decorative and/or user interactive LEDs and other kinds of loads, it is often desirable to detect the place where a certain effect is desired. For instance, in a string of LEDs, one can think of a user indicating one or several LEDs to be activated, which indication is detected by some kind of sensor. After said detection, a driver or the like has to deliver the energy to this specific location. For many applications, resolution and accuracy requirements put on the detection are quite high, in order to avoid a mismatch between desired and realized effect.

For optical effects like the ones created with LEDs, the control may be based on cameras and a dedicated picture processing algorithm. In this case, good alignment can be expected. For other, non-optical effects, the determination of the actual effect position is quite complicated, so that there is hardly any possibility of applying a feedback signal to the controller. In addition to these control problems, the driver has to offer a high resolution in order to reproduce most of the desired effects at the specific location.

However, the detection and control devices known in the art are quite complicated, especially when a large area and/or many devices have to be controlled. This in turn leads to relatively high costs.

It is therefore an object of the present invention to provide cost-efficient and accurate means for user interactive powering of loads.

DISCLOSURE OF INVENTION

The problem is solved by a circuit arrangement according to claim 1, an LED lamp according to claim 14 and a method according to claim 15.

The basic idea of the invention is to provide operating power to multiple loads in a distributed arrangement in dependence on the physical proximity of a detection object to a proximity sensor unit comprising a variable reactance. When said detection object is present, a change in said reactance occurs, causing a change in an operating voltage for the load. This operating voltage may be decreased or, preferably, increased as a result of the presence of said detection object, thus providing power to the load.

The invention accordingly provides a circuit arrangement for selective powering of distributed loads. In this context, "distributed" means that the loads are positioned in different locations. They may be next to each other or spaced apart. They may in particular be arranged in a one-dimensional way, like on a string, or in a two-dimensional way. "Load" here and in the following refers to any device that consumes power when a voltage is applied to it. The power may be transformed into light, mechanical energy, heat etc. Preferably, the load unit is non-linear, i.e. the power consumption of the load exhibits a non-linear relationship with the applied operating voltage.

The circuit arrangement according to the invention comprises a plurality of load segments. Each load segment is electrically connected to at least one supply terminal for receiving a variable voltage, i.e., the supply terminal has to be suited for providing such a voltage. For example, the supply terminal may be permanently connected (e.g. by soldering) to a voltage supply or it may form a part of a plug-and-socket system, where the variable voltage is provided externally. A variable voltage in this case refers to an alternating voltage in the broadest sense, i.e. any voltage that changes over time, like sine wave, square wave, triangular wave, pulsed etc. Preferably, the variable voltage is a pulsed voltage, as will be discussed in the following.

Each load segment comprises at least a load unit and a proximity sensor unit.

In this context, a load unit can be any kind of device or part of a device that is a load in the abovementioned sense. It is conceivable that the circuit arrangement comprises loads that are not associated with a proximity sensor unit; these, however, are not regarded as a part of a load segment in the abovementioned sense.

The proximity sensor unit is coupled with said load unit at least during operation and comprises at least a reactive device. The reactive device has a reactance, which depends on the proximity of a detection object. The reactance of any—capacitive or inductive—device coincides with an electric or magnetic field that is generated by the device. This field may be modified by an object entering the field. For instance, a ferromagnetic object entering the magnetic field of an inductor will change said field, thereby changing the inductance of the inductor and thus changing its reactance. A similar effect occurs when a dielectric object enters the field of a capacitor. According to the invention, this effect is used to detect whether an object is in the vicinity of the reactive device or not. Within the scope of the invention, the reactance may be due to capacitance and/or inductance, e.g. the reactive device may comprise at least one capacitor and/or inductor having a variable reactance.

As will be explained below, it is preferred that the proximity sensor unit and the load unit to which it is coupled are disposed relatively close to each other. In this case, each load segment forms a "segment" in a spatial sense. However, it is also conceivable that there is no strict spatial relationship between the sensor unit and the load unit of one load segment.

It should be noted that it is within the scope of the invention that at least one load segment may comprise more than one load unit and/or more than one sensor unit. Also, a proximity sensor unit may comprise more than one reactive device. It is also within the scope of the invention that at least some reactive devices or different load segments are not separate components, but form a single entity.

During operation of the inventive circuit arrangement, an operating voltage is provided to at least one load unit, depending on the reactance of at least one reactive device of one of the load segments, so that said operating voltage depends on the proximity of said detection object. This means that the circuit arrangement is disposed such that the reactance of at least one reactive device affects the operating voltage supplied to at least one load unit. Preferably, the operating voltage is changed even if the voltage applied at the supply terminal is not changed. Since the above-mentioned voltages may be time-dependent, the change may refer to the time development, e.g. to the frequency, pulse width, pulse delay etc.

The operating voltage thus is controlled by the reactive device, so that advantageously no further driver electronics are necessary e.g. for processing a detection signal and controlling the operating voltage. Said control is provided by the load segments themselves by means of simple and cheap components, as will be explained below. The cost of an inventive circuit arrangement accordingly is proportional to the number of load segments. However, irrespective of whether only a few or hundreds of load elements are comprised, said control is always provided without the need for additional systems. Thus, the inventive circuit arrangement provides a very simple and cost-effective way of controlling loads. In one embodiment, the reactive device of a load segment controls the amount of power provided to the load unit in this segment. In another embodiment, the reactive device of a load segment influences a voltage signal, so that the power delivered to the load unit in a different segment is changed.

In operation, a suitable object may be placed near a reactive device, for instance a ferromagnetic object may be placed near an inductor. The magnetic field will be altered by the object, i.e. the inductance of the inductor and therefore its reactance will increase. As will be explained further with respect to preferred embodiments, the circuit arrangement is designed so that this change of reactance will lead to a change of the operating voltage applied to at least one load unit. In particular, the voltage change may be an increase which leads to an activation of the load unit.

Within the scope of the invention, the voltage applied to one load unit may depend on the reactance of several reactive devices. On the other hand, the reactance of one reactive device may influence the voltage applied to several load units.

In one embodiment of the invention, an operating voltage is provided during operation to the load unit of one of said load segments, depending on the reactance of the reactive device of said load segment. In this case, control is localised within each load segment, i.e. the proximity of said detection object to said one load segment causes a decrease or, preferably increase of an operating voltage that is provided at least to the load unit of the same load segment. Hence, each load segment may have its own, local control system, which can be very simple and which eliminates the need for complicated elements like processors or the like. However it is conceivable that here the operating voltage depends to some extent on the reactance of other reactive devices.

It is preferred that the sensor unit and the load unit of one load segment are located close or adjacent to each other. In this case, the effect (for instance, the activation) may occur next to the cause, i.e. where the object is placed. In other words, the "addressing" of a particular load is realized by interaction with an object in proximity to the circuit arrangement.

The inventive circuit arrangement is particularly useful if at least one of said load units is a solid state light generation unit and most preferably an LED unit. The LED unit may comprise one or more light emitting devices, which may be e.g. an inorganic LED, organic LED (OLED), a solid state laser or the like. However, additionally, each load element may comprise a loudspeaker, a vibration device (motor), a heating element, an energy transfer coil etc. It is also conceivable within the scope of the invention to combine different load units, for instance by using LEDs for some load units and vibration devices for others. Further, a load unit may be an LED unit and comprise e.g. a combination of an LED and a vibration device. If several devices are combined in one load unit, these may be connected in series and/or in parallel. Further elements may be present, e.g. elements to provide voltage or current to one of the load units in a load segment, based on the current consumption of another segment. This enables certain characteristics, e.g. nonlinearity of one load segment, to be "copied" to other load segments or the nonlinearity of one load to be copied to another load within the same load segment. A corresponding embodiment, which may include a current mirror device, will be explained in greater detail hereinbelow.

Furthermore, the load units do not necessarily form separate parts. In one preferred embodiment of the invention, at least some LED units form an integral part of one OLED. OLEDs having an extended planar structure can be produced. In this case, certain areas of the light-emitting plane may be selectively activated by locally applying a voltage. One or several of these OLEDs may be used and the reactive devices may form a grid or the like below or above the light-emitting plane.

In a preferred embodiment, the plurality of load segments are arranged in a spatial relation with each other adjacent to a detection area. In this detection area, a detection object can cause a change in the reactance of a reactive device. In this embodiment, the load segments may be spaced apart, or adjacent to each other or they may even form a single component. The latter may in particular apply to the load units of the load segments. The detection area may have different shapes. It may be planar, convex or concave. If the load segments are essentially aligned in a one-dimensional manner, the detection area can be narrow and elongate or even tubular, thus surrounding the load segments.

In particular, the sensor units of the load segments may be arranged adjacent the detection area. The detection area preferably corresponds to a surface of a device into which the circuit arrangement is integrated. In this case, the distance of an object from the surface corresponds to the distance from the respective load segment (or, in particular, the sensor unit). The load segments may also be arranged in a one-dimensional way along a detection axis, which may be straight or curved. In a two-dimensional arrangement, the sensor units and/or the load units may be arranged in parallel to a detection plane, for example along a first and a second perpendicular axis, i.e., the respective units may form a two-dimensional, "Cartesian" grid.

In a preferred embodiment of the circuit arrangement, a plurality of load segments comprise at least a first and a second segment input terminal and a first and a second segment output terminal, wherein the input terminals of a first load segment are connected to the at least one supply terminal. Further load segments are arranged so that their segment input terminals are connected to segment output terminals of a neighbouring load segment, i.e. the load segments are connected in series. Thus, a first propagation path for the variable voltage is formed by said first segment input and output terminals of said plurality of load segments. A second propagation path for said variable voltage is formed by the second input and output terminals of said plurality of load segments. Thus, the first segment input/output terminals and the second input/output terminals are the connection points of two linear or two-dimensional structures, and the variable voltage applied to the supply terminal may propagate from one segment to the next. Certainly, the first segment input/output terminals should be electrically connected with each other either directly or indirectly, i.e. using intermediate components. The same applies to the connection of said second segment input/output terminals. The propagation speed of the variable voltage signal—and its shape—can be modified, depending on the reactance of each load segment. This will be explained further below.

In the embodiment described above, the load unit is preferably connected between said first and said second propagation path. Preferably, the load unit can be connected between the first segment input terminal and the second input terminal of a given load segment or between the first segment output terminal and the second segment output terminal, i.e, between corresponding points of the two propagation paths. However, it may also be connected between the first segment input terminal and the second segment output terminal or even between terminals belonging to different load segments.

In one embodiment of the invention, the reactive device comprises at least a first reactive element. This reactive element may be an inductor or a capacitor. Herein, the first reactive element is arranged so that propagation of the variable voltage from one load segment to a neighbouring load segment is delayed, wherein the delay depends on the reactance of the first reactive element. In this embodiment, the speed of the variable voltage along one propagation path may be delayed depending on the reactance of the reactive element. It is particularly advantageous if the reactive device comprises an inductor and a capacitor.

In one embodiment, the reactive device further comprises a second reactive element, wherein the first and the second reactive element are disposed so that the proximity of the detection object has a greater influence on the reactance of the first reactive element than on the reactance of the second reactive element. Preferably, the first reactive element and the second reactive element are arranged so that the distance between the first reactive element and the detection area is less than the distance between the second reactive element and said detection area. Thus, an object placed in or near the detection area will usually have a greater influence on the reactance of the first reactive element. In particular, the influence on the second reactive element may be negligible. Therefore, if the two reactive elements correspond to different propagation paths, the delay in one propagation path will be more affected by the proximity of a detection object than the delay in the other propagation path. Hence, if the applied voltage is chosen properly, voltage differences between given points of the two paths will depend on the proximity of a detection object.

In a particularly preferred embodiment, the first reactive element is a first inductor that is arranged between the first segment input terminal and the first segment output terminal. Thus, the first inductor is connected "in series" with respect to the first propagation path. In this embodiment, the reactance of the first inductor depends on the proximity of a detection object. If the load unit is connected between the first and the second input (output) terminal and a voltage difference occurs between these terminals, this difference is applied to the load unit. The existence and strength of this voltage difference will depend on the propagation speed of the voltage signals in the respective propagation paths. This speed, in turn, depends on the delay caused by the reactance of the first inductor.

Alternatively or additionally, the first reactive element may be a first capacitor that is connected between said first propagation path and a reference terminal for a reference potential. Thus, the first capacitor is connected "in parallel" with respect to the first propagation path. In an operational state, the reference terminal is connected to this reference potential, which is preferably ground potential. The first capacitor can be connected between the first segment input terminal or the first segment output terminal and the reference terminal. Anyway, in this embodiment, the reactance of the first capacitor depends on the proximity of a detection object.

Preferably, the circuit arrangement further comprises a second inductor that is arranged between the second segment input terminal and the second segment output terminal.

Alternatively or additionally, the circuit arrangement may comprise a second capacitor that is connected between the second propagation path and a reference terminal for a reference potential. This reference terminal may be identical or different from the abovementioned reference terminal. Usually, both terminals will be identical and connected to ground potential.

According to one embodiment, the type and/or arrangement of the second inductor is identical to that of the first inductor or the type and/or arrangement of the second capacitor is identical to that of the first capacitor, respectively. More generally, the first and the second inductor (or capacitor, respectively) may be disposed so that they have the same effect on the propagation of the variable voltage signal. Thus, the two propagation paths may have identical conductive properties, as long as no detection object is present.

Operation of the circuit arrangement typically requires some kind of voltage supply. Preferably, the circuit arrangement comprises a driver unit, which is connected with the at least one supply terminal for providing at least one pulsed voltage signal to the load segments. The shape of the pulses may be e.g. rectangular, triangle-shaped, half-wave-shaped, Gaussian or other convenient shapes. The (temporal and spatial) distance of the pulses may advantageously be chosen such that if reflections occur in the circuit arrangement, no significant interaction between consecutive pulses is possible. It is within the scope of the invention that different pulsed signals are applied if several input terminals are present.

In particular, it is conceivable that two voltage signals are applied from opposite sides of the propagation paths, i.e. one signal may start in the first propagation path at the first load segment and a second signal may start in the second propagation path at the "last" load segment. This principle is described e.g. in WO 2010/064184. Superposition of the pulses may occur at a certain load segment and cause the activation of the load unit. If the speed of one signal is altered by the proximity of a detection object, the position of the "constructive" superposition will shift to a different load segment.

It is preferred that the driver is configured to provide pulsed voltage signals with a given time relationship to the first and second input terminals of said first load segment. The time evolution of the voltage at either input terminal may be the same, but the starting point of the time evolution may be different, i.e., the driver may apply some "offset" delay to one of the voltage signals. If there is no such delay and the signals are applied simultaneously, the initial conditions for each of the voltage signals are identical. Hence, if the following load segments are symmetric regarding the elements between the first segment input and output terminal on the one hand and the elements between the second input and output terminal on the other hand, the signals will propagate with equal speed and shape. Only if the reactance of a reactive device is changed, a delay and/or distortion of one signal may occur. However, it may be necessary to apply some offset delay at the first or second input terminal in order to compensate for some kind of unwanted delay effects occurring within the circuit arrangement.

In this case, it is possible to use pulsed voltage signals with an amplitude that is at least equal to a threshold voltage of the load element. The threshold voltage is a voltage which is critical for the activation of the load unit. Below the threshold voltage, there is no perceptible activation of the load. Therefore, in the abovementioned case, no voltage is applied to the load element if the pulses along the two propagation paths overlap completely, but a voltage above the threshold voltage may be applied if there is some delay in one of the pulses.

However, numerous other embodiments are conceivable. For instance, positive pulses in the first propagation path may be combined with negative pulses in the second propagation path. If these are applied with an "offset" delay, normally no overlap occurs. If the pulses overlap due to a delay by a detection object, the difference between the positive and negative pulses leads to effective adding of voltages which may activate the load element.

In another embodiment of the invention, the reactive device comprises at least a capacitor, which is arranged in series with the load unit. The capacitor will block any direct current, while its reactance will allow some frequency-dependent current flow if an alternating voltage is applied. Since the load unit is connected in series, the current flowing through it will be the same as that through the capacitor. Depending on the voltage applied, it is possible to choose the characteristics of the capacitor such that no perceptible activation of the load unit occurs without any object in the proximity. If a detection object enters the electric field generated by the capacitor, said field will be affected, leading to a change of the reactance of the capacitor. This, in turn, may lead to an increased current through the load unit, resulting in activation, e.g. lighting up of an LED. Usually, the detection object will increase the capacitance of the capacitor; therefore its reactance will be reduced when a detection object is in the proximity e.g. in a detection area. In this context, the detection object may be the hand or foot of a user, since the human body has a considerable relative permittivity, which will affect the reactance of the capacitor when placed in the field generated by said capacitor.

Preferably, the capacitor is configured so that the voltage applied to the load unit is below a threshold voltage if no detection object is in proximity to said load segment and said voltage is at least temporarily above said threshold voltage if said detection object is in proximity to said load segment in said detection plane. Thus, the load unit remains inactive if no object is in proximity to the load segment and will become active when an object comes near. If the load unit is an LED, the threshold voltage is the forward voltage.

There are several conceivable embodiments of a capacitor. In a preferred embodiment, the capacitor comprises first and second electrodes, which are disposed in the proximity of the detection area. More preferably, the first and second electrodes are planar-shaped and disposed in parallel to a two-dimensional detection area. In particular, the detection area itself may be planar. It is conceivable that the capacitors of several load segments have individual first (second) electrodes, while they share a common second (first) electrode.

As mentioned above, the invention is particularly useful for operation of LEDs. Therefore, the present invention also provides an LED lamp which comprises a circuit arrangement as depicted above. The surface of the lamp may correspond to a detection plane, on which an object —including the hand of a user— is placed to change the voltage applied to the individual LEDs, OLEDs or parts of an OLED.

The present invention further provides a method of selective powering of distributed loads with a circuit arrangement comprising a plurality of load segments, each being electrically connected to at least one supply terminal for receiving a variable voltage, wherein each load segment comprises at least a load unit and a proximity sensor unit, coupled with said load unit and comprising at least a reactive device having a reactance, said reactance depending on the proximity of a detection object. According to the inventive method, an operating voltage is provided to at least one load unit depending on the reactance of at least one reactive device so that said operating voltage depends on the proximity of said detection object.

BRIEF DESCRIPTION OF THE DRAWINGS

These and other aspects, features and advantages of the present invention will be apparent from and elucidated with reference to the description of preferred embodiments in conjunction with the enclosed figures, in which.

DESCRIPTION OF EMBODIMENTS

Figure 1:
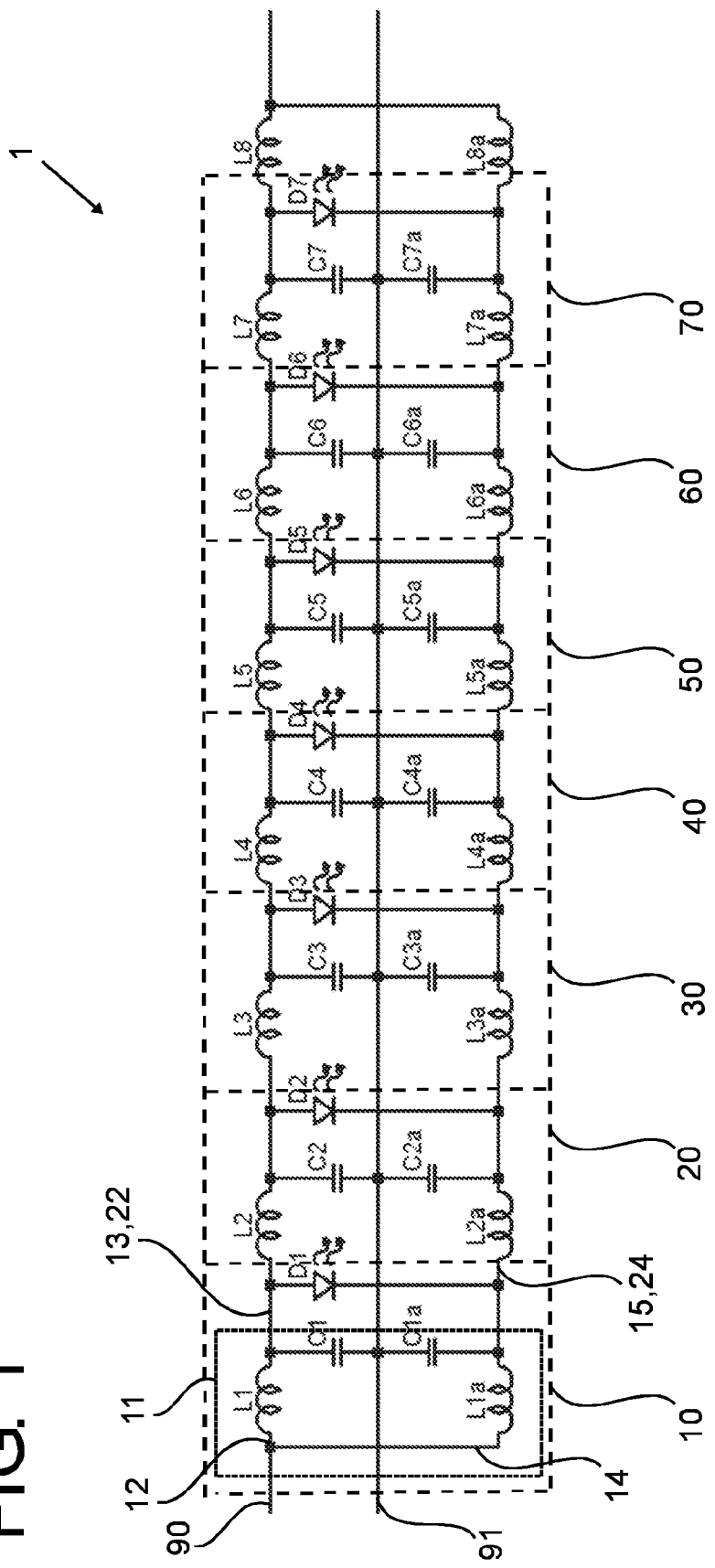
FIG. 1 shows a first embodiment of a circuit arrangement according to the present invention.

FIG. 1 shows a circuit arrangement 1 according to the present invention. The circuit arrangement 1 comprises seven load segments 10, 20, 30, 40, 50, 60, 70, which are identical in setup. Therefore, only the setup of the first load segment 10 will be described in detail hereinafter. The first load segment 10 comprises a first segment input terminal 12, a first segment output terminal 13, a second segment input terminal 14 and a second segment output terminal 15. In this case, the output terminals 13, 15 are identical to the input terminals 22, 24 of a second load segment 20.

As can be seen from FIG. 1, the layout of the circuit arrangement 1 as well as that of the first load segment 10 are largely symmetric. A first inductor L1 is connected between the first segment input terminal 12 and the first segment output terminal 13, while an e.g. identical second inductor L1a is connected between the second input terminal 14 and the second output terminal 15. Further, a first capacitor C1 is connected between the first segment output terminal 13 and a reference terminal 91. Accordingly, a second capacitor C1a is connected between the second segment output terminal 15 and the reference terminal 91. At least in an operational state, the reference terminal 91 is connected to ground. The abovementioned inductors L1, L1a and capacitors C1, C1a constitute a proximity sensor unit 11. The circuit arrangement 1 is disposed so that the first inductor L1 is closer to a detection area than the second inductor L1a. The same applies to the respective inductors L2 to L7 and L2a to L7a in the remaining load segments 20-70. If the circuit arrangement 1 is built into a device with a surface, the detection area may be located adjacently above the surface.

Along the first segment input and output terminals of the consecutive load segments 10-70, a first propagation path for a variable voltage signal is formed, while a second propagation path for a variable voltage signal is formed along the second input and output terminals of the load segments 10-70. In the embodiment shown, the first and second propagation paths are supplemented by two inductors L8, L8a, which are disposed opposite the first load segment 10.

Referring to the first load segment 10 again, a LED D1 is connected between the first segment output terminal 13 and the second segment output terminal 15. The voltage applied to the LED D1 is therefore identical to the difference between the voltages applied to the first and the second segment output terminal 13, 15, or, more generally speaking, a voltage difference between the first and second propagation path.

The first and second input terminals 12, 14 are connected to a supply terminal 90. In an operational state, the supply terminal 90 is connected to a driver unit (not shown), which is configured to apply a variable voltage signal being, according to the present example, a pulsed voltage signal.

Figure 2:
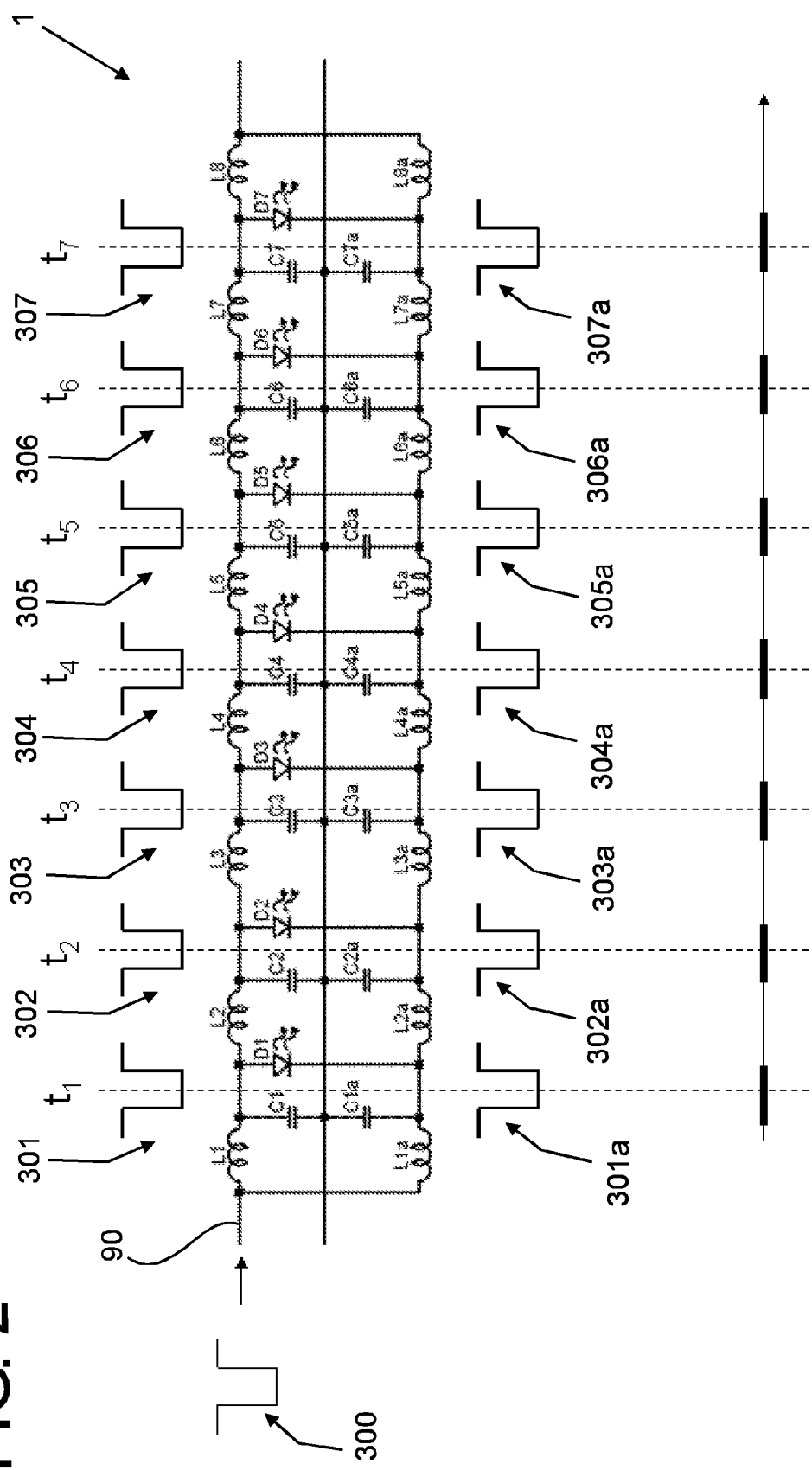
FIG. 2 illustrates the propagation of pulsed voltage signals in the circuit arrangement of fig.1 with no detection object present.

FIG. 2 shows the propagation of said pulsed voltage signal through the first and second propagation paths if no detection object is present. In this case, the driver unit applies a negative rectangle pulse 300 to the supply terminal 90. Accordingly, this pulse 300 is applied to the first and second segment input terminals 12, 14. Due to the symmetrical layout of the two propagation paths, the propagation of the voltage signals will be identical.

In the upper part of FIG. 2, above the circuit arrangement, the time development of the voltage pulses 301 to 307 at the respective first segment output terminals is shown for certain time periods around the points in time t1, t2, t3 etc., in which the voltage pulse passes the respective first segment output terminals. Accordingly, below the circuit arrangement 1, FIG. 2 shows the time development of the voltage pulses 301a to 307a at the respective second segment output terminals for these time periods. Since, for instance, the LED D1 of the first load segment 10 is connected between the first segment output terminal 13 and the second segment output terminal 15, the difference of the voltage pulses 301, 301a occurring at these terminals 13, 15 is applied to the LED D1. However, since the reactance of the corresponding inductors L1, L1a and that of the corresponding capacitors C1, C1a is identical, the delay of the voltage signal by the first inductor L1 and the first capacitor C1 on the one hand and the second inductor L1a and the second capacitor C1a on the other hand is the same. Therefore, the difference between these voltages, which is applied to the LED D1, is zero. The same applies to the voltage difference in the other load segments 20 to 70. This voltage difference is shown in the lowest part of FIG. 2.

Figure 3:
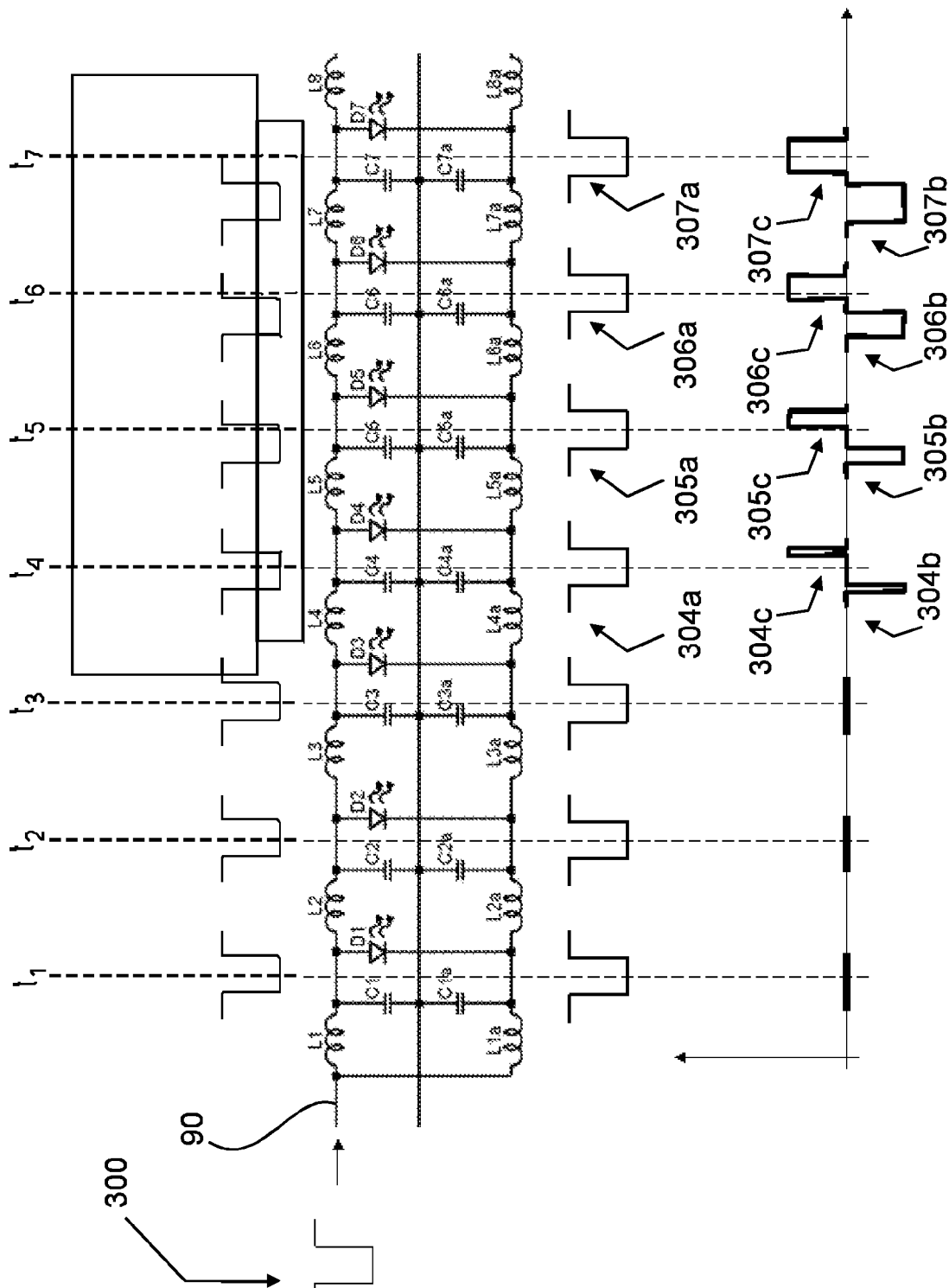
FIG. 3 illustrates the propagation of pulsed voltage signals in the circuit arrangement of FIG. 1 in the presence of a detection object.

This changes, however, if an object 100 with magnetic layer 101 enters the detection area, as shown in FIG. 3. In this case, the object 100 in the detection area is adjacent to the fourth to seventh load segments 40, 50, 60, 70. Therefore, the inductance of the first inductors L4, L5, L6, L7 of these load segments will be increased, which corresponds to an increase of the reactance. Since the second inductors L4a, L5a, L6a, L7a of these load segments are disposed at a greater distance from the detection area, they are virtually unaffected by the presence of the detection object 100. Therefore, the time evolution of the voltage pulses 304a, 305a, 306a, 307a at the respective second segment output terminals is unchanged in relation to FIG. 2. However, the voltage pulses 304, 305, 306, 307 at the respective first segment output terminals exhibit an increasing delay. Therefore, the difference between the voltages at the first and second segment output terminals, which is again shown in the lowest part of FIG. 3, is zero for the first three load segments 10, 20, 30, but, for the fourth to seventh load segment 40, 50, 60, 70, it exhibits negative pulses 304b, 305b, 306b, 307b, which are followed by positive pulses 304c, 305c, 306c, 307c. Since the amplitude of the pulse 300 is chosen to be above the forward voltage of the LEDs, the corresponding LEDs D4, D5, D6, D7—or at least some of them—will temporarily light up. The voltage applied to the load has both polarities. With the single LEDs D1 to D7 used here, only one polarity of the pulse will be used to generate light, while the LEDs D1 to D7 may have to be protected from the reverse bias voltage. As will be explained later in combination with a capacitive embodiment, both polarities of a load voltage may be used to power the LED by using extra components or multiple LED junctions. These methods can be applied here, too.

If the LED of each load segment is disposed near the respective proximity sensor unit, the light effect will appear at or near the location where the object 100 is placed. Therefore, "addressing" of the LED is achieved by very simple and cheap components. It is understood that although the above described embodiment comprises seven load segments, it is possible to include several tens or even hundreds of load segments.

It should be noted that the voltage pulses shown in the lowest part of FIG. 3 do not take into account the power consumption of the LEDs when they light up. For ease of illustration, this influence has been neglected.

Figure 4:
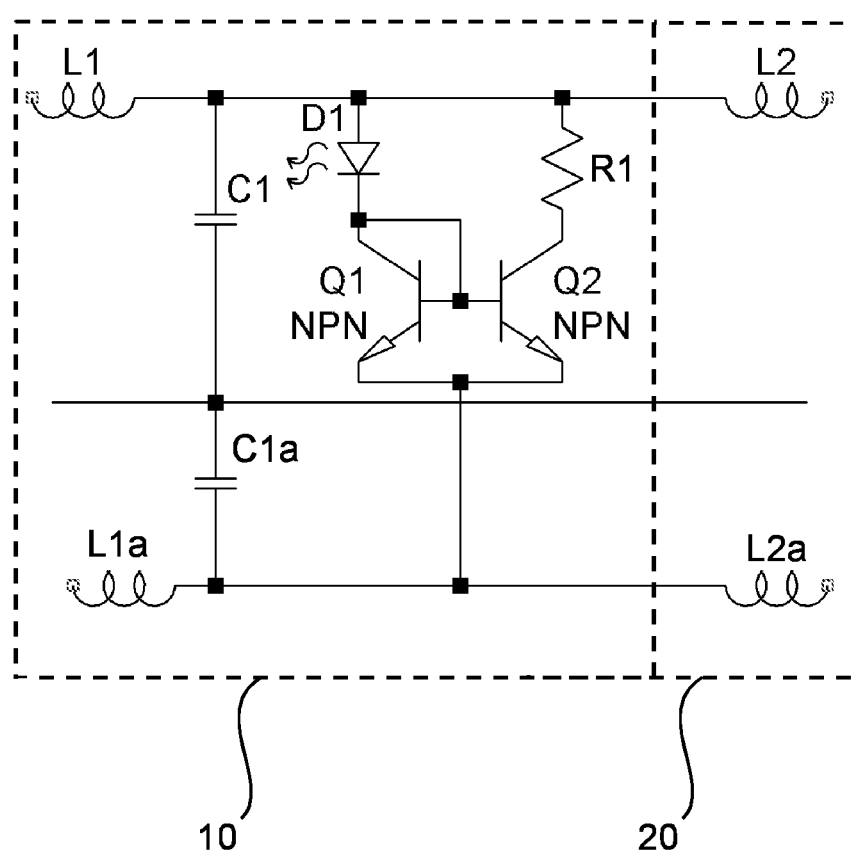
FIG. 4 shows a detail of a variant of the circuit arrangement shown in FIGS. 1-3.

Now, referring to fig.4, there is shown a detail of an alternative embodiment of the circuit arrangement shown in FIGS. 1-3. In this embodiment the nonlinearity of the LED D1 (a first load) of one load segment is "copied" to a second load R1 in the same load segment. For the sake of clarity, only the part from the first and the second inductor L1, L1a of the first load segment 10 to the first and second inductor L2, L2a of the second load segment 20 is shown. The following load segments may be designed similarly.

FIG. 4 illustrates a unipolar embodiment, which employs a current mirror device formed by two transistors Q1, Q2. As shown in FIG. 4, the current into the LED D1 flows through one leg (collector) of a first transistor Q1 of the current mirror device Q1, Q2. The second load R1 (schematically shown as a resistor), which does not show a nonlinear behaviour, is connected to the second leg (collector) of a second transistor Q2 of the current mirror device. As long as there is no current through the LED D1, there will also be no current in the second load R1, regardless of the characteristic of the second load R1. As soon as there is a current flow in the LED D1, there may also be a current in the second load R1. Accordingly, the nonlinear behaviour of the LED D1 is "copied" to second load R1.

The maximum current in the second load R1 will be the minimum of a) the original load current of the second load R1 at the current voltage in the second load segment 10 and b) the current in the LED D1 multiplied by the current transfer ratio of the current mirror Q1, Q2.

Alternative embodiments may include a current measuring resistor in series with the LED D1, and a controlled current or voltage source for setting the current in the second load.

Besides the current ratio, also additional offsets may be introduced, e.g. by having diodes in series with the second load R1.

Figure 5:
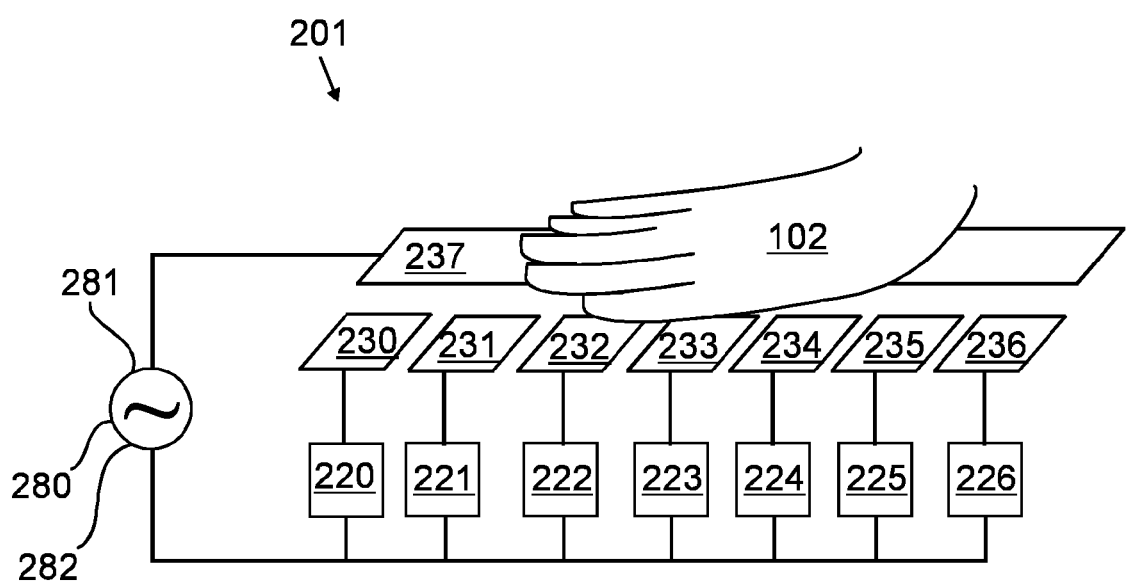
FIG. 5 schematically shows a perspective view of another embodiment of a circuit arrangement according to the present invention.

Referring to FIG. 5, there is shown a different embodiment of a circuit arrangement 201 according the present invention, which is shown in a perspective view. Herein, the reactive elements are constituted by a plurality of capacitors. These capacitors are constituted by a series of primary electrodes 230 to 236 which are disposed in parallel to a two-dimensional detection area. Next to these primary electrodes, a secondary electrode 237 is also disposed in parallel to the detection area. This means that the capacitors have one common secondary electrode 237. Alternatively, individual secondary electrodes might be used. The secondary electrode 237 is connected to a first terminal 281 of a driver unit 280. Each of the primary electrodes 230 to 236 is connected in series with a load unit 220 to 226, which is in turn connected to a second terminal 282 of the driver unit 280. For instance, the first primary electrode 230 is connected in series with a first load unit 220. Herein, the load units 220 to 226, which are only schematically shown, can be e.g. LED units.

In an operational state, the driver unit 280 applies an alternating voltage to its terminals 281, 282, which may be sine-shaped. The size and arrangement of the primary and secondary electrodes are chosen so that the capacitance of the capacitors is rather low. Therefore, the reactance of the capacitor is rather high, which results in a rather low voltage applied to the load unit. If the load units 220 to 226 are LED units, an off state of the LED can be assured by using additional load elements, such as resistors, to bypass small signals. If, however, a dielectric object, like a hand 102 of a user, is in proximity to the primary and secondary electrodes, the capacitance is increased and the reactance is decreased. Hence, the voltage applied to the load unit becomes higher which may lead to its activation. FIG. 5 shows a hand 102 of a user placed over several primary electrodes 230, 231, 232, 233, which leads to the activation of the corresponding load units 220, 221, 222, 223. For instance, LEDs comprised in the load units may light up where the hand 102 of the user is close to the surface in which the circuit arrangement 201 is embedded.

Figure 6:
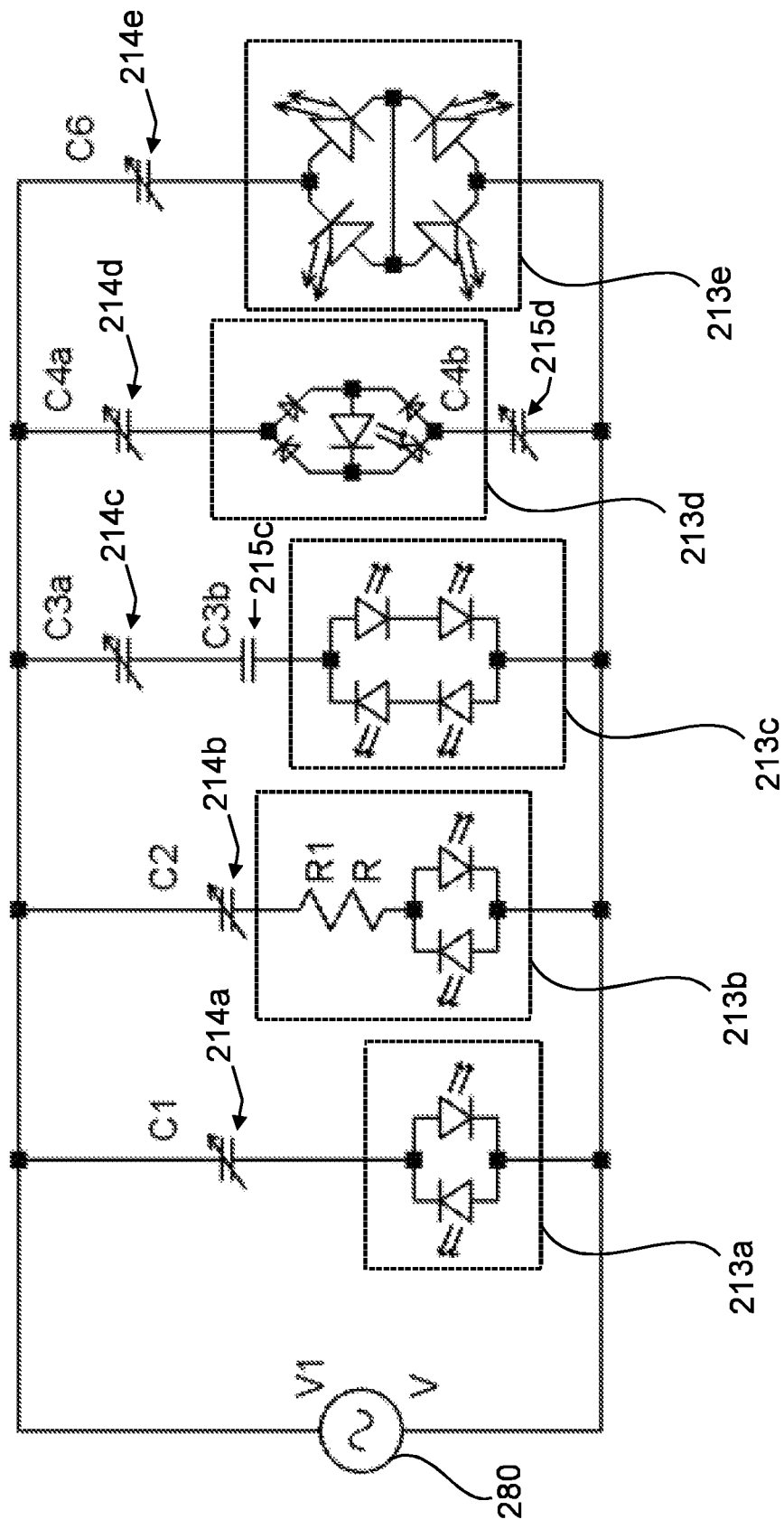
FIG. 6 shows several different LED arrangements for the circuit arrangement in FIG. 5.

FIG. 6 shows different diode arrangements that may be used as load units 220 to 226, e.g. in the circuit arrangement in FIG. 5. For ease of illustration, the different load segments 213a to 213e are shown as parts of one circuit. However, in a circuit arrangement as shown in FIG. 5, usually only one type of load segment is used.

A first load unit 213a comprises two anti-parallel LEDs. This is the simplest design that allows lighting of one LED irrespective of the voltage polarity. The primary and secondary electrodes and the detection object (hand of a user) are schematically represented by an adjustable capacitor 214a. Here, a resistor my be placed in parallel with the two LEDs to ensure off state or a dim light level when no object is in the detection area.

In a second load unit 213b, the two anti-parallel LEDs are connected in series with a resistor R, which may serve to limit the current through the LEDs. In a third load unit 213c, each of the anti-parallel LEDs is replaced by two LEDs connected in series. The third load unit 213c is connected in series with an adjustable capacitor 214c and a non-adjustable capacitor 215c. However, a non-adjustable capacitor may also be employed in connection with the other load units shown. In a fourth load unit 213d, an LED is integrated into a bridge rectifier. Here, both terminals of the rectifier are connected to adjustable capacitors 214d, 215d. Again, two adjustable capacitors may also be used in connection with the other load units shown. In a fifth load unit 213e, four LEDs serve as diodes for a bridge rectifier.

It should be noted that the load units 213a to 213e shown in FIG. 6 could also be used in the circuit arrangement of fig.1 instead of the single LEDs.

Other variations to the disclosed embodiments can be understood and effected by those skilled in the art of practicing the claimed invention from the drawings, the disclosure and the appended claims.

In the foregoing description and in the appended claims, a reference to the singular is also intended to encompass the plural and vice versa and reference to a specific number of features or devices is not to be construed as limiting the invention to the specific numbers of features or devices. Moreover, expressions such as "include" or "comprise" do not exclude other elements and the indefinite article "a" or "an" does not exclude a plurality.

The mere fact that certain measures are recited in mutually different dependent claims does not indicate that a combination of these measures cannot be used to advantage. Any reference signs in the claims should not be construed as limiting the scope of the claims.

The invention claimed is:

1. Circuit arrangement for selective powering of distributed loads, comprising a plurality of load segments, each being electrically connected to at least one supply terminal for receiving a variable voltage, wherein each load segment comprises at least
    a load unit and
    a proximity sensor unit, coupled with said load unit and comprising at least a reactive device having a reactance, said reactance depending on the proximity of a detection object, wherein during operation an operating voltage is provided to at least one load unit, depending on the reactance of at least one reactive device of said load segments, so that said operating voltage depends on the proximity of said detection object.

2. Circuit arrangement according to claim 1, wherein during operation an operating voltage is provided to the load unit of one of said load segments, depending on the reactance of the reactive device of said one of said load segments.

3. Circuit arrangement according to claim 1, wherein said load unit is an LED unit.

4. Circuit arrangement according to claim 1, wherein said plurality of load segments are arranged in a spatial relationship with each other adjacent to a detection area.

5. Circuit arrangement according to claim 1, wherein
    a plurality of said load segments comprise at least a first and a second segment input terminal and a first and a second segment output terminal,
    said input terminals of a first load segment are connected to said at least one supply terminal,
    further load segments are arranged so that their segment input terminals are connected to segment output terminals of a neighbouring load segment, so that a first propagation path for said variable voltage is formed by said first segment input and output terminals of said plurality of load segments and a second propagation path for said variable voltage is formed by the second input and output terminals of said plurality of load segments, and
    said load unit is connected between said first and said second propagation path.

6. Circuit arrangement according to claim 1, wherein said reactive device comprises at least a first reactive element, said first reactive element being arranged so that propagation of said variable voltage signal from one load segment to a neighbouring load segment is delayed, wherein the delay depends on the reactance of the first reactive element.

7. Circuit arrangement according to claim 6, wherein said reactive device further comprises a second reactive element, wherein said first reactive element and said second reactive element are arranged so that the distance between the first reactive element and said detection area is less than the distance between said second reactive element and said detection area.

8. Circuit arrangement according to claim 7, wherein:
said first reactive element is a first inductor that is arranged between said first segment input terminal and said first segment output terminal, and
the reactance of the first inductor depends on the proximity of said detection object.

9. Circuit arrangement according to claim 6, wherein:
said first reactive element is a first capacitor that is connected between said first propagation path and a reference terminal for a reference potential, and
wherein the reactance of the first capacitor depends on the proximity of said detection object.

10. Circuit arrangement according to claim 1, further comprising a driver unit connected with said at least one supply terminal for providing at least one pulsed voltage signal to said load segments.

11. Circuit arrangement according to claim 1, wherein the reactive device comprises at least a capacitor, said capacitor being arranged in series with said load unit.

12. Circuit arrangement according to claim 11, wherein the capacitor is configured so that the voltage applied to said load unit is below a threshold voltage if no detection object is in proximity to said load segment and said voltage is at least temporarily above said threshold voltage if said detection object is in proximity to said load segment.

13. Circuit arrangement according to claim 12, wherein the capacitor comprises first and second electrodes, said electrodes being planar-shaped and disposed in parallel with a two-dimensional detection area.

14. LED lamp comprising a circuit arrangement according to claim 1.

15. Method of selective powering of distributed loads with a circuit arrangement the method comprising
electrically connecting each of a plurality of load segments to at least one supply terminal configured for receiving a variable voltage, wherein each load segment comprises at least a load unit and a proximity sensor unit, coupled with said load unit and comprising at least a reactive device having a reactance, said reactance depending on the proximity of a detection object, and
selectively providing an operating voltage to at least one load unit, depending on the reactance of at least one reactive device, so that said operating voltage depends on the proximity of said detection object.

* * * * *